United States Patent
Van Bokhoven et al.

(10) Patent No.: US 12,461,448 B2
(45) Date of Patent: Nov. 4, 2025

(54) MULTI-CHANNEL LIGHT SOURCE FOR PROJECTION OPTICS HEATING

(71) Applicants: ASML Netherlands B.V., Veldhoven (NL); ASML Holding N.V., Veldhoven (NL)

(72) Inventors: Laurentius Johannes Adrianus Van Bokhoven, Bergeijk (NL); Mahesh Upendra Ajgaonkar, Guilford, CT (US)

(73) Assignee: ASML NETHERLANDS B.V. & ASML HOLDING N.V., Veldhoven (NL)

( * ) Notice: Subject to any disclaimer, the term of this patent is extended or adjusted under 35 U.S.C. 154(b) by 138 days.

(21) Appl. No.: 18/273,618

(22) PCT Filed: Dec. 30, 2021

(86) PCT No.: PCT/EP2021/087888
§ 371 (c)(1),
(2) Date: Jul. 21, 2023

(87) PCT Pub. No.: WO2022/161736
PCT Pub. Date: Aug. 4, 2022

(65) Prior Publication Data
US 2024/0077803 A1 Mar. 7, 2024

Related U.S. Application Data

(60) Provisional application No. 63/142,131, filed on Jan. 27, 2021.

(51) Int. Cl.
*G03F 7/20* (2006.01)
*G03F 7/00* (2006.01)

(52) U.S. Cl.
CPC .......... *G03F 7/702* (2013.01); *G03F 7/70166* (2013.01); *G03F 7/70208* (2013.01); *G03F 7/70891* (2013.01)

(58) Field of Classification Search
CPC .. G03F 7/702; G03F 7/70166; G03F 7/70208; G03F 7/70891; G02B 5/0891; G02B 7/1815
See application file for complete search history.

(56) References Cited

U.S. PATENT DOCUMENTS 6,952,253 B2   10/2005   Lof et al.
7,511,799 B2   3/2009    Tel et al.
(Continued)

FOREIGN PATENT DOCUMENTS

DE   102020207748 A1   3/2021
TW      201130113 A     9/2011
(Continued)

OTHER PUBLICATIONS

International Search Report and Written Opinion of the International Searching Authority directed to International Patent Application No. PCT/EP2021/087888, mailed Apr. 22, 2022; 8 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

Systems, apparatuses, and methods are provided for heating a plurality of optical components. An example method can include receiving an input radiation beam from a radiation source. The example method can further include generating a plurality of output radiation beams based on the input radiation beam. The example method can further include transmitting the plurality of output radiation beams towards a plurality of heater head optics configured to heat the (Continued)

plurality of optical components. Optionally, the example method can further include controlling a respective power value, and realizing a flat-top far-field profile, of each of the plurality of output radiation beams.

24 Claims, 10 Drawing Sheets

(56) References Cited

U.S. PATENT DOCUMENTS

| | | |
|---|---|---|
| 2008/0204682 A1 | 8/2008 | Uehara et al. |
| 2008/0246933 A1* | 10/2008 | Uchikawa ........... G03F 7/70883 355/71 |
| 2013/0077074 A1 | 3/2013 | Major et al. |
| 2017/0120337 A1 | 5/2017 | Kanko et al. |
| 2018/0123314 A1 | 5/2018 | Hunter, Jr. |
| 2020/0201197 A1 | 6/2020 | Janssen et al. |

FOREIGN PATENT DOCUMENTS

| | | |
|---|---|---|
| TW | 201523164 A | 6/2015 |
| WO | WO 2014/139543 A1 | 9/2014 |
| WO | WO 2019/042656 A1 | 3/2019 |

OTHER PUBLICATIONS

International Preliminary Report on Patentability directed to International Patent Application No. PCT/EP2021/087888, issued Jul. 31, 2023; 6 pages.

Taiwanese Office Action directed to Taiwanese Patent Application No. 111100169, mailed Aug. 19, 2025; 22 pages.

* cited by examiner

MULTI-CHANNEL LIGHT SOURCE FOR PROJECTION OPTICS HEATING

CROSS-REFERENCE TO RELATED APPLICATIONS

This application claims priority of U.S. application 63/142,131 which was filed on Jan. 27, 2021, and which is incorporated herein in its entirety by reference.

TECHNICAL FIELD

The present disclosure relates to systems and methods for heating optical components, such as mirrors, in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

The present disclosure describes various aspects of systems, apparatuses, and methods for heating a plurality of optical components, such as mirrors and sectors thereof, disposed in or associated with a projection optics box (POB) of an EUV radiation system. In some aspects, an embodiment includes a multi-channel infrared (IR) light source for POB preheating and sector heating.

In some aspects, the present disclosure describes a system. The system can include a radiation redistribution system configured to provide radiation for heating a plurality of optical components. The radiation redistribution system can include an optical input channel configured to receive an input radiation beam from a radiation source. The radiation redistribution system can further include a radiation splitting system configured to generate a plurality of output radiation beams based on the input radiation beam. The radiation redistribution system can further include a plurality of optical output channels configured to transmit the plurality of output radiation beams towards a plurality of heater head optics configured to heat the plurality of optical components.

In some aspects, the optical input channel can consist of, or consist essentially of, a single input fiber. In some aspects, the radiation splitting system can include a set of radiation splitting devices. The set of radiation splitting devices can include, for example, one or more multi-mode fiber couplers, one or more fixed ratio couplers, one or more variable ratio couplers, one or more beam splitters, one or more of any other suitable optical component, or any combination thereof.

In some aspects, the radiation redistribution system can further include a plurality of power control devices configured to control a respective power value of each of the plurality of output radiation beams. In some aspects, the plurality of power control devices can include a plurality of variable optical attenuators (VOAs). In some aspects, the radiation redistribution system further can include a despeckler device.

In some aspects, the present disclosure describes an apparatus. The apparatus can include an optical input channel configured to receive an input radiation beam from a radiation source. The apparatus can further include a set of radiation splitting devices configured to generate a plurality of output radiation beams based on the input radiation beam. The apparatus can further include a plurality of optical output channels configured to transmit the plurality of output radiation beams towards a plurality of heater head optics configured to heat the plurality of optical components.

In some aspects, the optical input channel can consist of, or consist essentially of, a single input fiber. In some aspects, the set of radiation splitting devices can include one or more multi-mode fiber couplers, one or more fixed ratio couplers, one or more variable ratio couplers, one or more beam splitters, one or more of any other suitable optical component, or any combination thereof.

In some aspects, the apparatus can further include a plurality of power control devices configured to control a respective power value of each of the plurality of output radiation beams. In some aspects, the plurality of power control devices can include a plurality of variable optical attenuators. In some aspects, the apparatus can include a despeckler device.

In some aspects, the present disclosure describes a method for heating a plurality of optical components via a plurality of heater head optics. The method can include receiving, by an optical input channel, an input radiation beam from a radiation source. The method can further include generating, by a set of radiation splitting devices, a plurality of output radiation beams based on the input radiation beam. The method can further include transmitting, by a plurality of optical output channels, the plurality of output radiation beams towards a plurality of heater head optics configured to heat a plurality of optical components. In some aspects, the method can further include controlling, by a plurality of power control devices, a respective power value of each of the plurality of output radiation beams.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
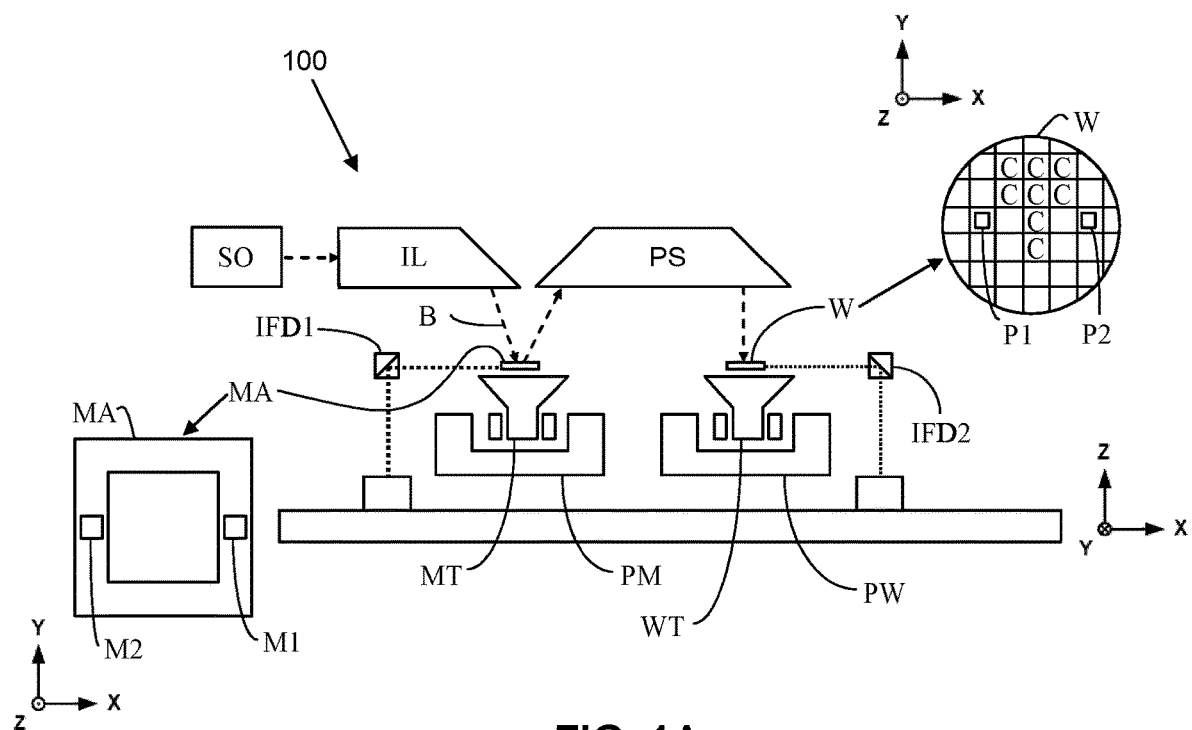
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

The suffix "A-N" as used herein means "A through N," where "N" represents the total amount of separate, substantially similar components of the reference character preceding the suffix "A-N." For example, "A-N" represents two separate components A-B when N equals two, four separate components A-D when N equals four, seven separate components A-G when N equals seven, and so forth.

Overview

In one example, a lithographic apparatus can be equipped with mirror preheating electronics. For example, each heater head inside the POB is connected to a dedicated laser light source to provide individual power control per heater head. However, as the number of segments to be equipped with mirror preheating and sector heating increases (e.g., from about six to over sixty segments to be individually controlled over time), the total costs, complexity, and power consumption of the laser light sources increases as well. In addition, multiple cabinets would be additionally needed to accommodate all of these laser light sources. Further, a ten time increase in the number of laser light sources can also negatively affect the availability of the lithographic apparatus.

In contrast, some aspects of the present disclosure can provide using a single infrared (IR) light source for all preheaters and sector heaters of a given POB mirror by splitting light from a single input fiber as many times as needed to achieve the desired number of output channels, where each output channel can be equipped with its own power control (e.g., VOA). In some aspects, the present disclosure provides for using fixed ratio couplers to split the light from a single launch fiber into separate fiber branches per heater head. The fiber branch for preheating can consist of a single fiber and a variable optical attenuator for control power. The fiber branch for sector heating can be first split using another fixed ratio coupler so as to have seven optical output channels for each sector heater head. Each of the seven output channels can have its own variable optical attenuator for power control. In some aspects, the present disclosure may be extended so as to have a single IR light source for all preheaters and sector heaters associated with a given POB mirror. Additionally or alternatively, in some aspects, the present disclosure may provide for using: a single, cheaper light source (e.g., an IR diode) per segment; galvo mirrors to split light into different fiber outputs; freespace beam splitters coupled to motor-controlled variable optical attenuators (VOAs) for power attenuation; a motor-controlled lens for redirecting light to a specific output fiber or beam trap (e.g., to maintain a power level of the light source); a digital light processing (DLP) chip for redirecting light to a specific output fiber or beam trap; diffractive optical elements (DOE) with a fused fiber bundle coupled to VOAs for power attenuation; fiber demultiplexing with multiple fiber Y-splitters in series coupled to VOAs for power attenuation; any other suitable component or technique; or any combination or subcombination thereof.

In some aspects, the present disclosure can provide for, or be used in association with, an optical heating system that comprises a light source, a light redistribution and passive mode scrambler, and heater head optics. For example, some aspects of the present disclosure can provide for a subcomponent of the heating system which redistributes light from one channel to multiple channels, with independent power control per output channel, and with a flat-top output profile independent of the input profile. In some aspects, the output from a light source laser may have a Gaussian profile, but the heater heads may require an input profile that is substantially flat (e.g., as flat as possible). In such aspects, the subcomponent of the heating system that connects the light source to the heater heads can be configured to deliver a stable flat-top output profile, such as by including a mode scrambler and a circular-core fiber with a mode-mixing element or a square or rectangular core fiber (e.g., a passive technique).

There are many exemplary aspects to the systems, apparatuses, methods, and computer program products disclosed herein. For example, aspects of the present disclosure provide for using a single IR light source, rather than multiple laser light sources, for all preheaters and sector heaters of a given POB mirror. As a result of the techniques described in the present disclosure, the total costs, volume claim, complexity, and power consumption of the radiation redistribution system can be reduced, and the availability of the lithographic apparatus can be improved (e.g., by reducing the number of laser light sources).

Before describing such aspects in more detail, however, it is instructive to present an example environment in which aspects of the present disclosure can be implemented.

Example Lithographic Systems

Figure 1B:
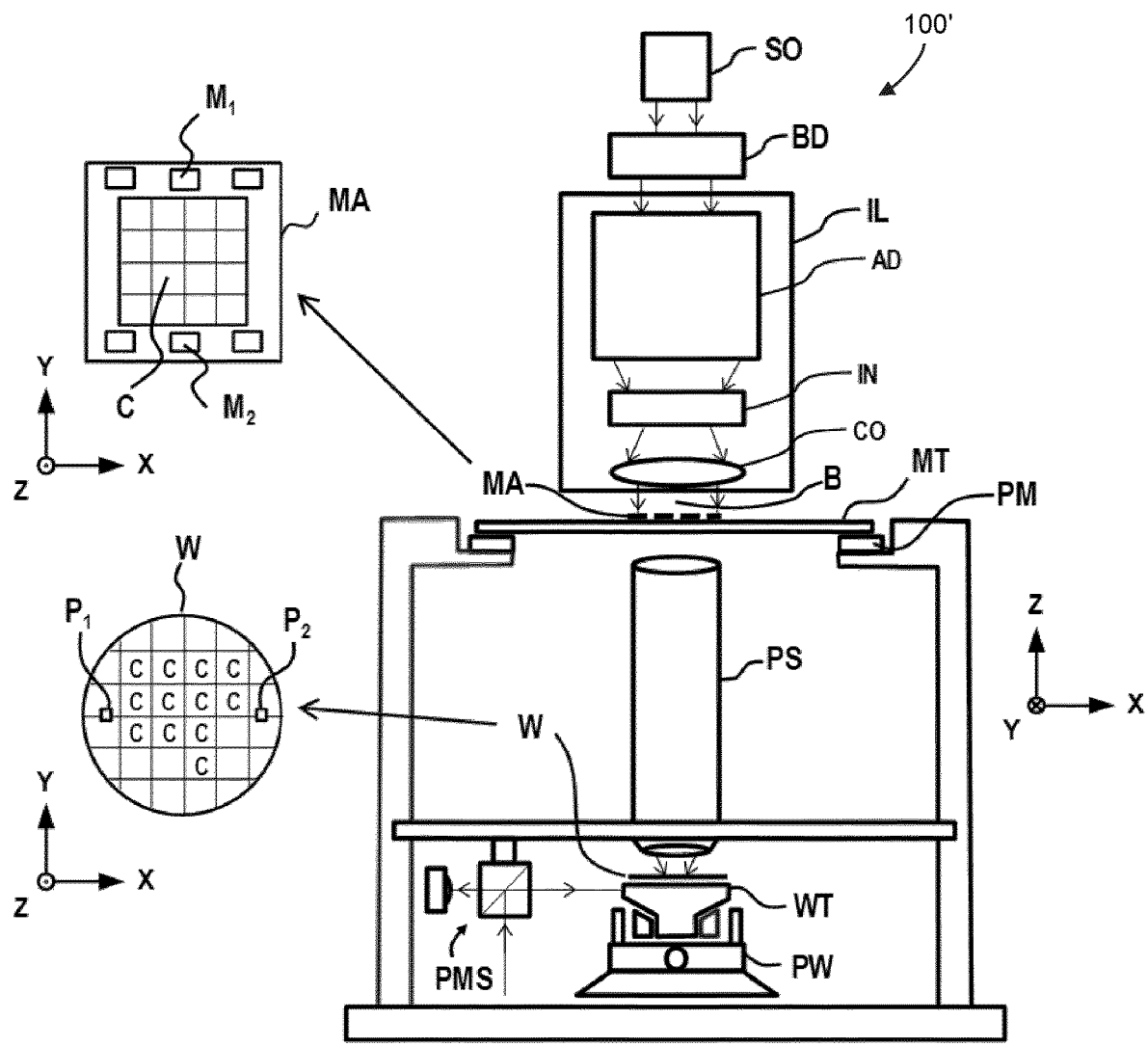
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an EUV radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks) Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
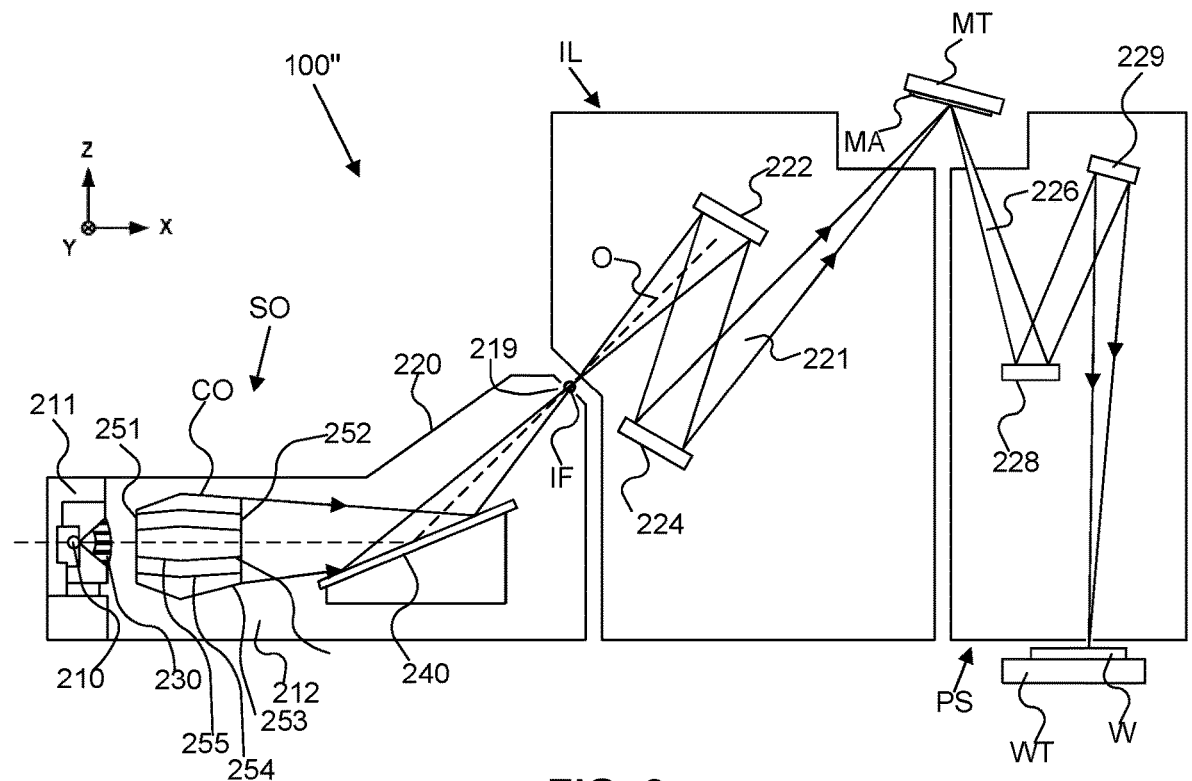
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress IR radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
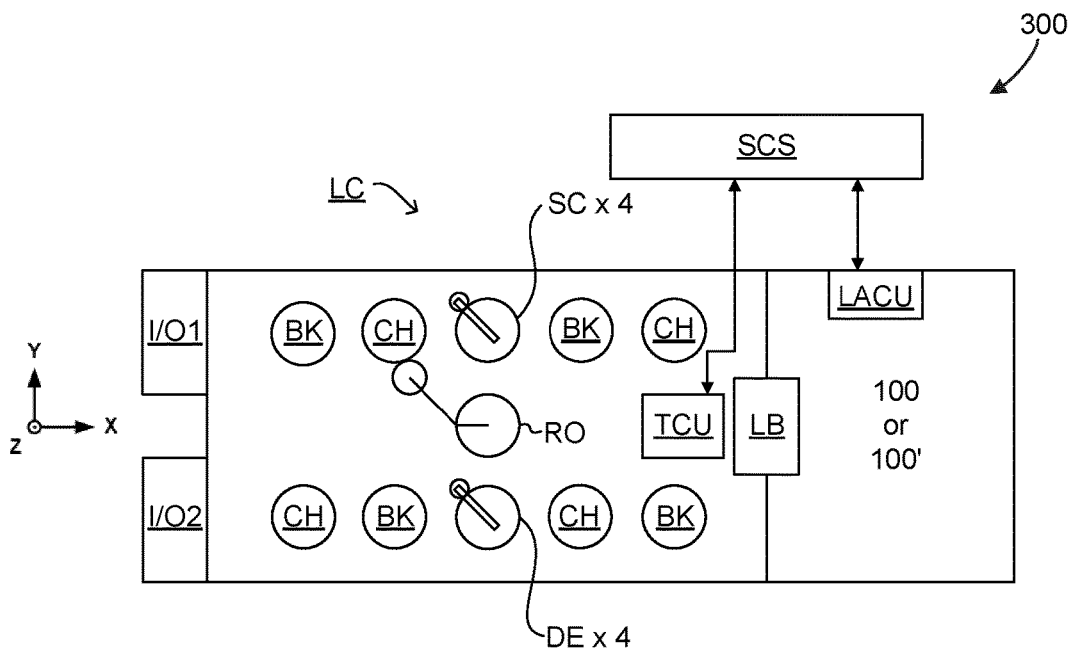
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Radiation Source

Figure 4:
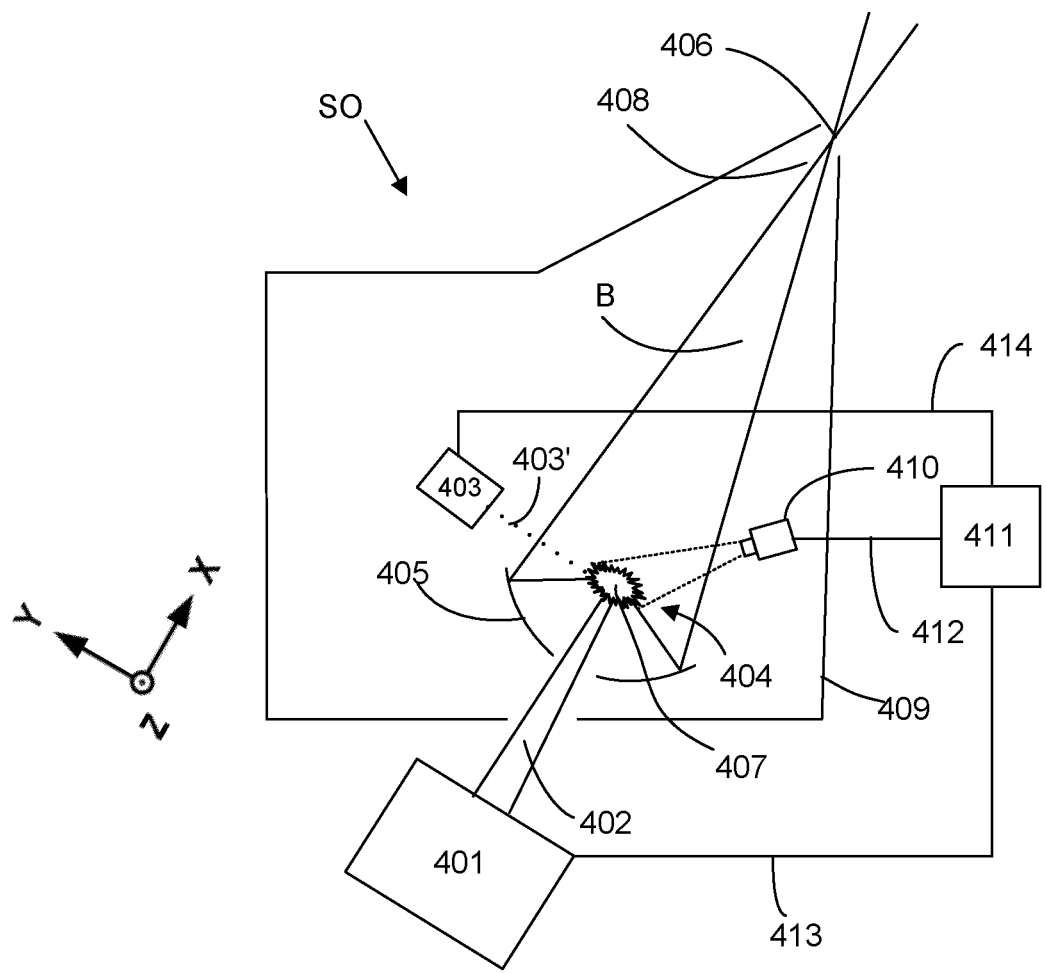
FIG. 4 is a schematic illustration of an example radiation source for an example reflective lithographic apparatus according to some aspects of the present disclosure.

An example of the radiation source SO for an example reflective lithographic apparatus (e.g., lithographic apparatus 100 of FIG. 1A) is shown in FIG. 4. As shown in FIG. 4, the radiation source SO is illustrated from a point of view (e.g., a top view) that is normal to the XY plane as described below.

The radiation source SO shown in FIG. 4 is of a type which can be referred to as a laser produced plasma (LPP) source. An example laser system 401, which can for example include a carbon dioxide ($CO_2$) laser, is arranged to deposit energy via one or more laser beams 402 into fuel targets 403', such as one or more discrete tin (Sn) droplets, which are provided from a fuel target generator 403 (e.g., example, fuel emitter, droplet generator). According to some aspects, the example laser system 401 can be, or can operate in the fashion of, a pulsed, continuous wave or quasi-continuous wave laser. The trajectory of fuel targets 403' (e.g., example, droplets) emitted from the fuel target generator 403 can be parallel to an X-axis. According to some aspects, the one or more laser beams 402 propagate in a direction parallel to a Y-axis, which is perpendicular to the X-axis. A Z-axis is perpendicular to both the X-axis and the Y-axis and extends generally into (or out of) the plane of the page, but in other aspects, other configurations are used. In some embodiments, the one or more laser beams 402 can propagate in a direction other than parallel to the Y-axis (e.g., in a direction other than orthogonal to the X-axis direction of the trajectory of the fuel targets 403').

In some aspects, the one or more laser beams 402 can include a pre-pulse laser beam and a main pulse laser beam. In such aspects, the example laser system 401 can be configured to hit each of the fuel targets 403' with a pre-pulse laser beam to generate a modified fuel target. The example laser system 401 can be further configured to hit each of the modified fuel targets with a main pulse laser beam to generate the plasma 407.

Although tin is referred to in the following description, any suitable target material can be used. The target material can for example be in liquid form, and can for example be a metal or alloy. Fuel target generator 403 can include a nozzle configured to direct tin, e.g., in the form of fuel targets 403' (e.g., discrete droplets) along a trajectory towards a plasma formation region 404. Throughout the remainder of the description, references to "fuel", "fuel target" or "fuel droplet" are to be understood as referring to the target material (e.g., droplets) emitted by fuel target generator 403. Fuel target generator 403 can include a fuel emitter. The one or more laser beams 402 are incident upon the target material (e.g., tin) at the plasma formation region 404. The deposition of laser energy into the target material creates a plasma 407 at the plasma formation region 404. Radiation, including EUV radiation, is emitted from the plasma 407 during de-excitation and recombination of ions and electrons of the plasma.

The EUV radiation is collected and focused by a radiation collector 405 (e.g., radiation collector CO). In some aspects, radiation collector 405 can include a near normal-incidence radiation collector (sometimes referred to more generally as a normal-incidence radiation collector). The radiation collector 405 can be a multilayer structure, which is arranged to reflect EUV radiation (e.g., EUV radiation having a desired wavelength such as about 13.5 nm). According to some aspects, radiation collector 405 can have an ellipsoidal configuration, having two focal points. A first focal point can be at the plasma formation region 404, and a second focal point can be at an intermediate focus 406, as discussed herein.

In some aspects, the example laser system 401 can be located at a relatively long distance from the radiation source SO. Where this is the case, the one or more laser beams 402 can be passed from the example laser system 401 to the radiation source SO with the aid of a beam delivery system (not shown) including, for example, suitable directing mirrors and/or a beam expander, and/or other optics. The example laser system 401 and the radiation source SO can together be considered to be a radiation system.

Radiation that is reflected by radiation collector 405 forms a radiation beam B. The radiation beam B is focused at a point (e.g., the intermediate focus 406) to form an image of plasma formation region 404, which acts as a virtual radiation source for the illumination system IL. The point at which the radiation beam B is focused can be referred to as the intermediate focus (IF) (e.g., intermediate focus 406). The radiation source SO is arranged such that the intermediate focus 406 is located at or near to an opening 408 in an enclosing structure 409 of the radiation source SO.

The radiation beam B passes from the radiation source SO into the illumination system IL, which is configured to condition the radiation beam B. The radiation beam B passes from the illumination system IL and is incident upon the patterning device MA held by the support structure MT. The patterning device MA reflects and patterns the radiation beam B. Following reflection from the patterning device MA the patterned radiation beam B enters the projection system PS. The projection system includes a plurality of mirrors, which are configured to project the radiation beam B onto a substrate W held by the substrate table WT. The projection system PS can apply a reduction factor to the radiation beam, forming an image with features that are smaller than corresponding features on the patterning device MA. For example, a reduction factor of four can be applied. Although the projection system PS is shown as having two mirrors in FIG. 2, the projection system can include any number of mirrors (e.g., six mirrors).

The radiation source SO can also include components which are not illustrated in FIG. 4. For example, a spectral filter can be provided in the radiation source SO. The spectral filter can be substantially transmissive for EUV radiation but substantially blocking for other wavelengths of radiation such as infrared radiation.

The radiation source SO (or radiation system) can further include a fuel target imaging system to obtain images of fuel targets (e.g., droplets) in the plasma formation region 404 or, more particularly, to obtain images of shadows of the fuel targets. The fuel target imaging system can detect light diffracted from the edges of the fuel targets. References to images of the fuel targets in the following text should be understood also to refer to images of shadows of the fuel targets or diffraction patterns caused by the fuel targets.

The fuel target imaging system can include a photodetector such as a CCD array or a CMOS sensor, but it will be appreciated that any imaging device suitable for obtaining images of the fuel targets can be used. It will be appreciated that the fuel target imaging system can include optical components, such as one or more lenses, in addition to a photodetector. For example, the fuel target imaging system can include a camera 410, e.g., a combination of a photosensor or photodetector and one or more lenses.

The optical components can be selected so that the photosensor or camera 410 obtains near-field images and/or far-field images. The camera 410 can be positioned within the radiation source SO at any appropriate location from which the camera has a line of sight to the plasma formation region 404 and one or more markers (not shown in FIG. 4) provided on the radiation collector 405. In some aspects, however, it can be necessary to position the camera 410 away from the propagation path of the one or more laser beams 402 and from the trajectory of the fuel targets emitted from fuel target generator 403 so as to avoid damage to the camera 410. According to some aspects, the camera 410 is configured to provide images of the fuel targets to a controller 411 via a connection 412. The connection 412 is shown as a wired connection, though it will be appreciated that the connection 412 (and other connections referred to herein) can be implemented as either a wired connection or a wireless connection or a combination thereof.

As shown in FIG. 4, the radiation source SO can include a fuel target generator 403 configured to generate and emit fuel targets 403' (e.g., discrete tin droplets) towards a plasma formation region 404. The radiation source SO can further include an example laser system 401 configured to hit one or more of the fuel targets 403' with one or more laser beams 402 for generating a plasma 407 at the plasma formation region 404. The radiation source SO can further include a radiation collector 405 (e.g., a radiation collector CO) configured to collect radiation emitted by the plasma 407.

Example Radiation Redistribution Systems

Figure 5:
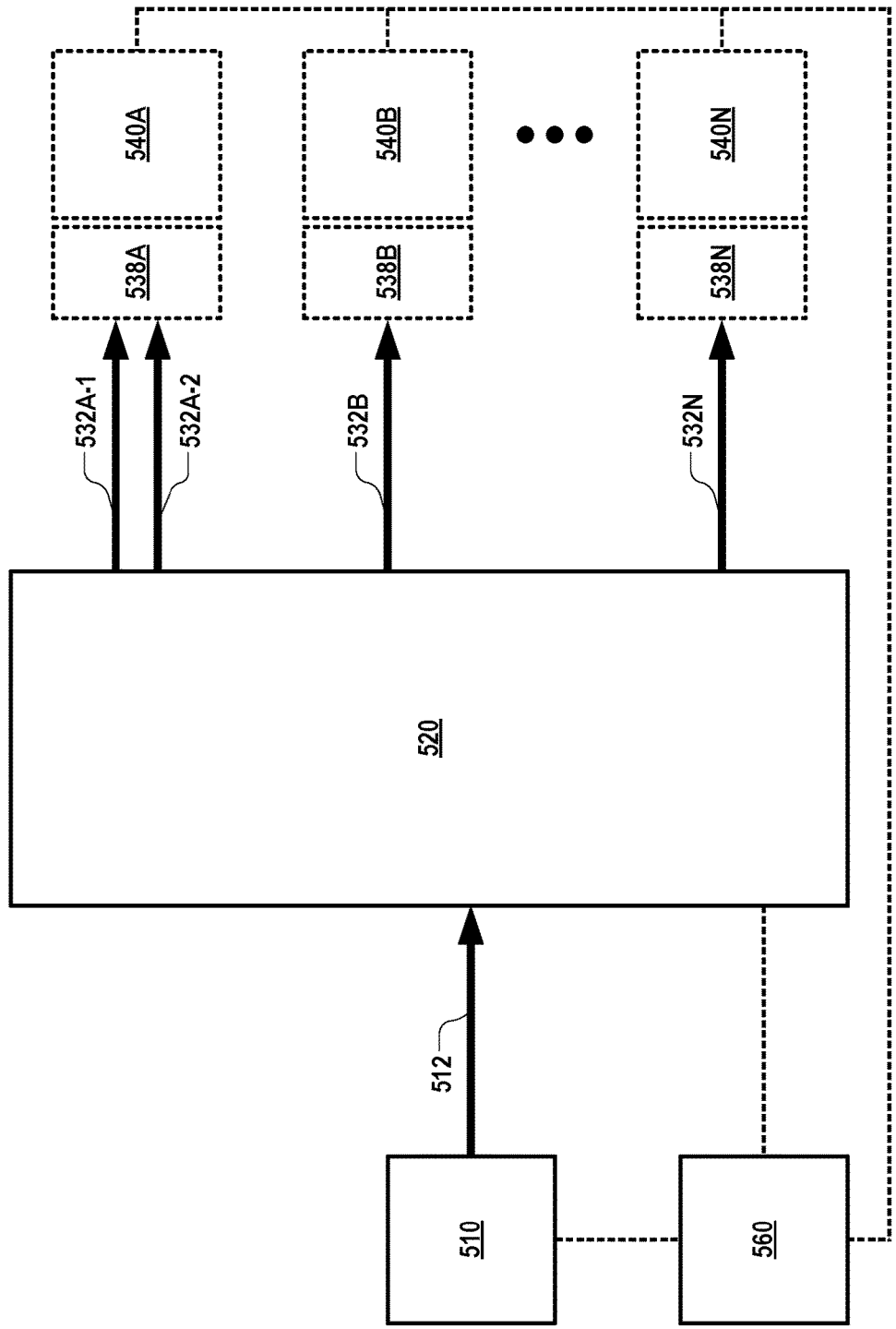
FIG. 5 is a schematic illustration of an example radiation redistribution system according to some aspects of the present disclosure.

FIG. 5 is a schematic illustration of an example radiation redistribution system 500 according to some aspects of the present disclosure. In some aspects, example radiation redistribution system 500 can be configured to provide radiation for heating a plurality of optical components 540A-N via a plurality of heater head optics 538A-N. In some aspects, each of plurality of optical components 540A-N can include a mirror (or, in some aspects, a sector of a mirror) and one or more sensors (e.g., temperature sensors, power sensors, beam profile sensors, etc.). In some aspects, plurality of optical components 540A-N can include a set of preheating devices associated with one or more POB mirrors. In some aspects, plurality of optical components 540A-N can further include a set of sector heating devices associated with the one or more POB mirrors.

In some aspects, example radiation redistribution system 500 can include an optical input channel 512 configured to receive an input radiation beam from a radiation source 510. In some aspects, radiation source 510 can include a multi-channel IR light source for preheating and sector heating of POB optical components, such as mirrors and sectors thereof. In some aspects, the input radiation beam can be an IR radiation beam. In some aspects, optical input channel 512 can consist of, or consist essentially of, a single input fiber.

In some aspects, example radiation redistribution system 500 can further include a radiation splitting system 520 configured to generate a plurality of output radiation beams based on the input radiation beam. In some aspects, radiation splitting system 520 can include a set of radiation splitting devices. The set of radiation splitting devices can include, for example, one or more multi-mode fiber couplers, one or more fixed ratio couplers, one or more variable ratio couplers, one or more beam splitters, one or more of any other suitable optical component, or any combination thereof. In some aspects, example radiation redistribution system 500 can further include a plurality of power control devices configured to control a respective power value of each of the plurality of output radiation beams. In some aspects, the plurality of power control devices can include a plurality of variable optical attenuators.

In some aspects, example radiation redistribution system 500 can further include a plurality of optical output channels 532A-N configured to transmit the plurality of output radiation beams towards plurality of optical components 540A-N. In some aspects, example radiation redistribution system 500 can further include a temperature control system 560 communicatively coupled to radiation source 510, radiation splitting system 520, and plurality of optical components 540A-N. In some aspects, temperature control system 560 can be configured to control a temperature of each of plurality of optical components 540A-N.

In some aspects, example radiation redistribution system 500 can provide for heating a plurality of optical components 540A-N via a plurality of heater head optics 538A-N. For example, example radiation redistribution system 500 can provide for receiving, by optical input channel 512, an input radiation beam from radiation source 510. Example radiation redistribution system 500 can further provide for generating, by radiation splitting system 520, a plurality of output radiation beams based on the input radiation beam. Example radiation redistribution system 500 can further provide for controlling, by a plurality of power control devices, a respective power value of each of the plurality of output radiation beams. Subsequently, example radiation redistribution system 500 can provide for transmitting, by plurality of optical output channels 532A-N, the plurality of output radiation beams towards plurality of heater head optics 538A-N to provide radiation for heating plurality of optical components 540A-N.

In some aspects, plurality of heater head optics 538A-N can be configured to image the radiation beams (e.g., IR radiation beams) from plurality of optical output channels 532A-N onto plurality of optical components 540A-N (e.g., the mirror surfaces). In some aspects, each of plurality of heater head optics 538A-N can receive, as input, one or more inputs over one or more of plurality of optical output channels 532A-N. For example, heater head optic 538A can be a sector heater head optic configured to receive, as input, two inputs over optical output channel 532A-1 and optical output channel 532A-2. In another example, heater head optic 538B can be a preheater head optic configured to receive, as input, a single input over optical output channel 532B. In some aspects, two, four, or more heater head optics may irradiate the same optical component 540.

Figure 6:
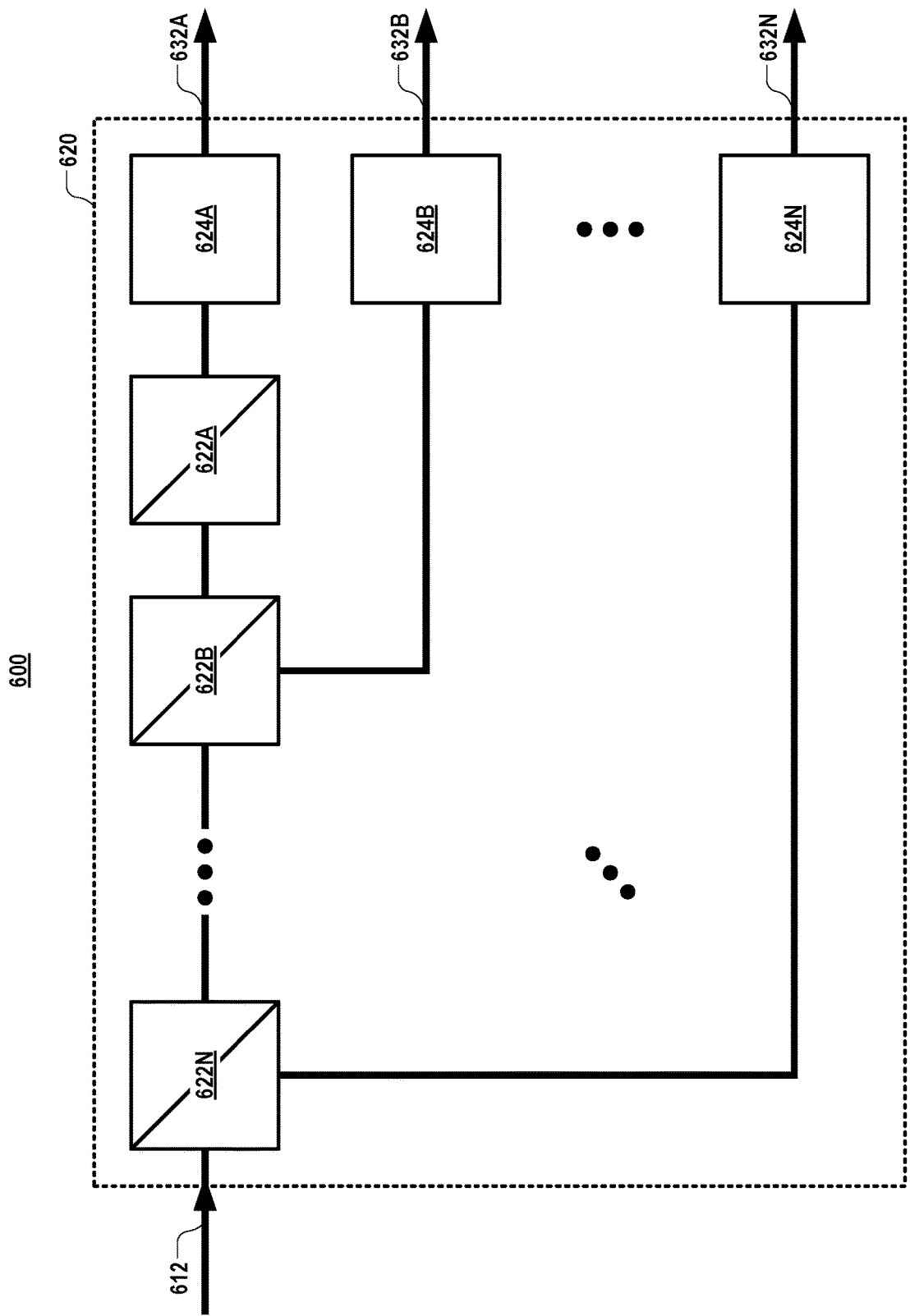
FIG. 6 is a schematic illustration of a portion of an example radiation redistribution system according to some aspects of the present disclosure.

FIG. 6 is a schematic illustration of a portion of an example radiation redistribution system 600 according to some aspects of the present disclosure. In some aspects, example radiation redistribution system 600 can provide for splitting a single optical input into multiple optical outputs with power control per output.

In some aspects, example radiation redistribution system 600 can include an optical input channel 612 configured to receive an input radiation beam (e.g., an IR radiation beam) from a radiation source (e.g., a multi-channel IR light source). In some aspects, optical input channel 612 can consist of, or consist essentially of, a single input fiber.

In some aspects, example radiation redistribution system 600 can further include a radiation splitting system 620 that includes a set of radiation splitting devices 622A-N configured to generate a plurality of output radiation beams based on the input radiation beam. In some aspects, set of radiation splitting devices 622A-N can include, for example, one or more multi-mode fiber couplers, one or more fixed ratio couplers, one or more variable ratio couplers, one or more beam splitters, one or more of any other suitable optical component, or any combination thereof. For example, set of radiation splitting devices 622A-N can include eight beam splitters per optical input (e.g., to provide seven optical output channels for heating each sector head and one optical output channel for preheating).

In some aspects, radiation splitting system 620 can further include a plurality of power control devices 624A-N configured to control a respective power value of each of the plurality of output radiation beams. In some aspects, plurality of power control devices 624A-N can include a plurality of VOAs (e.g., motor-controlled VOAs for power attenuation). In some aspects, example radiation redistribution system 600 can further include a plurality of optical output channels 632A-N configured to transmit the plurality of output radiation beams towards a plurality of heater head optics.

In some aspects (e.g., shown in FIG. 6), set of radiation splitting devices 622A-N can be freespace beam splitters, and plurality of power control devices 624A-N can be motor-controlled VOAs for power attenuation. In other aspects (not shown in FIG. 6 for sake of brevity), set of radiation splitting devices 622A-N and plurality of power control devices 624A-N can be replaced by a motor-controlled lens or a DLP chip for redirecting light to a specific one of the plurality of optical output channel 632A-N or a beam trap (e.g., to maintain a power level of an input radiation beam received over the optical input channel 612). In still other aspects (not shown in FIG. 6 for sake of brevity), set of radiation splitting devices 622A-N can be replaced by a DOE coupled to a fused fiber bundle that in turn is coupled to the plurality of power control devices 624A-N (e.g., VOAs) for power attenuation. In still further aspects (not shown in FIG. 6 for sake of brevity), set of radiation splitting devices 622A-N can be replaced by fiber demultiplexing with multiple fiber Y-splitters in series coupled to the plurality of power control devices 624A-N (e.g., VOAs) for power attenuation.

Figure 7:
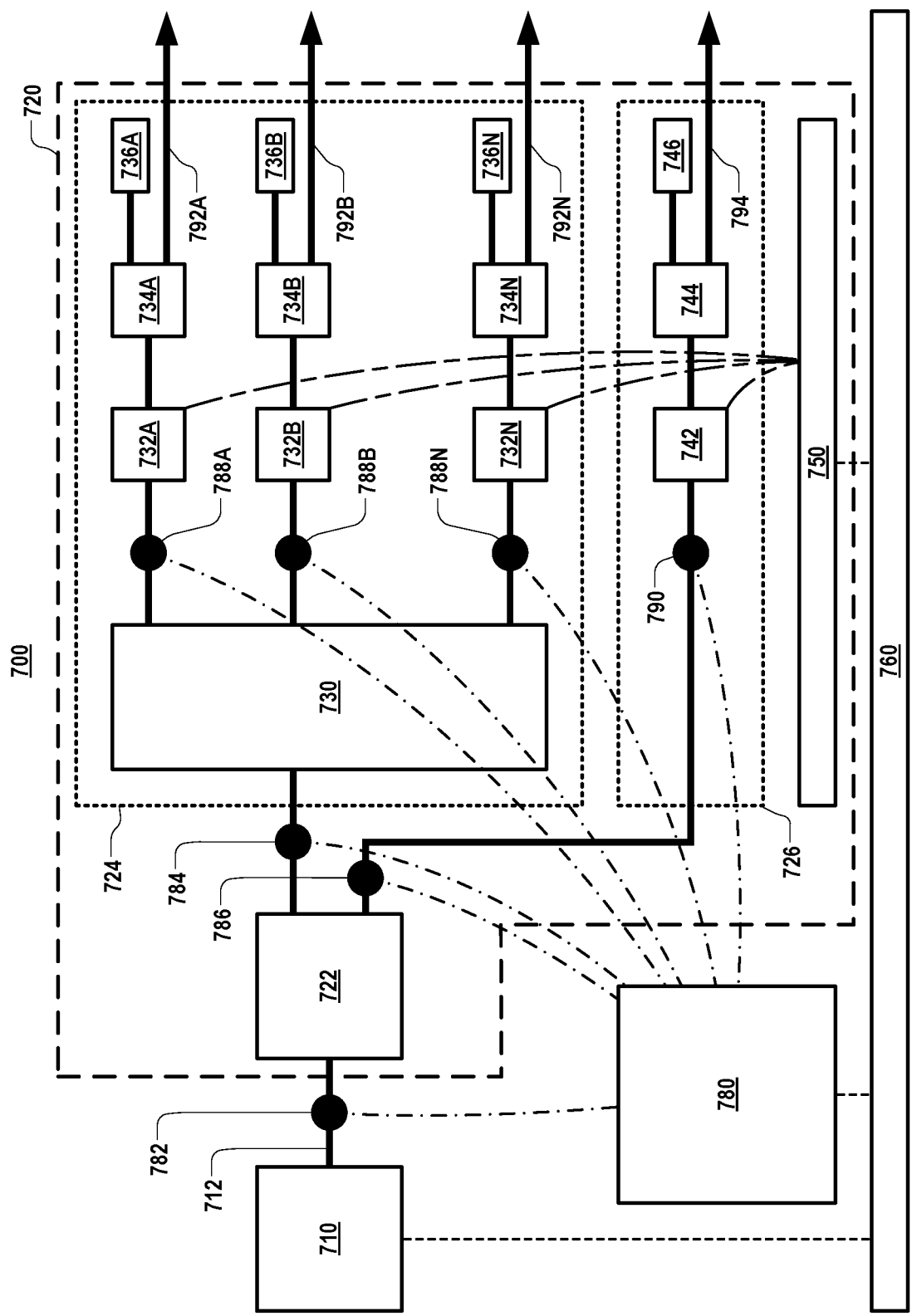
FIG. 7 is a schematic illustration of another example radiation redistribution system according to some aspects of the present disclosure.

FIG. 7 is a schematic illustration of an example radiation redistribution system 700 according to some aspects of the present disclosure. In some aspects, example radiation redistribution system 700 can be configured to thermally stabilize one or more mirror optical surfaces via, for example, a set of preheating devices (e.g., preheater head optics) and a set of sector heating devices (e.g., sector heater head optics).

In some aspects, example radiation redistribution system 700 can include an optical input channel 712 configured to receive an input radiation beam (e.g., an IR radiation beam) from a radiation source 710 (e.g., a multi-channel IR light source). In some aspects, optical input channel 712 can consist of, or consist essentially of, a single input fiber.

In some aspects, example radiation redistribution system 700 can further include a radiation splitting system 720 configured to generate a plurality of output radiation beams based on the input radiation beam. In some aspects, radiation splitting system 720 can include a radiation splitting device 722, which can include, for example, a multi-mode fiber coupler, a fixed ratio coupler, a variable ratio coupler, a beam splitter, any other suitable optical component, or any combination thereof. In some aspects, radiation splitting device 722 can be configured to split the input radiation beam into two radiation beams, transmitting one of the two radiation beams towards a sector heater branch 724 and the other of the two radiation beams towards a preheater branch 726.

In some aspects, sector heater branch 724 of radiation splitting system 720 can further include a radiation splitting device 730, which can include, for example, a multi-mode fiber coupler, a fixed ratio coupler, a variable ratio coupler, a beam splitter, any other suitable optical component, or any combination thereof. In some aspects, radiation splitting device 730 can be configured to split the radiation beam received from radiation splitting device 722 into a plurality of radiation beams (e.g., four radiation beams, seven radiation beams, twenty radiation beams) and transmit each of the plurality of radiation beams towards a plurality of power control devices 732A-N (e.g., VOAs) configured to control a respective power value of a respective radiation beam received from radiation splitting device 730.

In some aspects, sector heater branch 724 of radiation splitting system 720 can further include a plurality of radiation splitting devices 734A-N, each of which can include, for example, a multi-mode fiber coupler, a fixed ratio coupler, a variable ratio coupler, a beam splitter, any other suitable optical component, or any combination thereof. In some aspects, each of the plurality of radiation splitting devices 734A-N can be configured to split a respective radiation beam received from a respective one of the plurality of power control devices 732A-N into two radiation beams, transmitting a portion of the output radiation beam towards a respective one of a plurality of power sensors 736A-N (e.g., a power and beam profile sensor) and the remaining portion of the output radiation beam over a respective one of the plurality of optical output channels 792A-N towards a respective heater head optic (e.g., a respective sector heater device) configured to heat a respective optical component (e.g., a respective POB mirror surface). In some aspects, plurality of optical output channels 792A-N can include a plurality of circular core fibers with mode-mixing elements for flat-top, far-field profiles. In some aspects, plurality of optical output channels 792A-N can include a plurality of non-circular core fibers (e.g., square, rectangular, or polygon core fibers) to achieve flat top beam profile at the mirror surface.

In some aspects, preheater branch 726 of radiation splitting system 720 can include a power control device 742 (e.g., a VOA) configured to control a power value of the radiation beam received from radiation splitting device 722. In some aspects, preheater branch 726 of radiation splitting system 720 can further include a radiation splitting device 744, which can include, for example, a multi-mode fiber coupler, a fixed ratio coupler, a variable ratio coupler, a beam splitter, any other suitable optical component, or any combination thereof. In some aspects, radiation splitting device 744 can be configured to split the radiation beam received from power control device 742 into two radiation beams, transmitting a portion of the output radiation beam towards a power sensor 746 (e.g., a power and beam profile sensor) and the remaining portion of the output radiation beam over an optical output channel 794 towards a heater head optic (e.g., a preheater device) configured to heat an optical component (e.g., a POB mirror surface). In some aspects, optical output channel 794 can include a circular core fiber with mode-mixing elements for a flat-top, far-field profile. In some aspects, optical output channel 794 can include a non-circular core fiber (e.g., a square, rectangular, or polygon core fiber) to achieve a flat top beam profile at the mirror surface.

Additionally or alternatively, in some aspects, radiation splitting system 720 can further include one or more despeckler devices, active/passive mode scrambler devices, or a combination thereof, which can give rise to a flat intensity profile in the far field at the mirror surfaces. For example, example radiation redistribution system 700 can include a despeckler device disposed between radiation source 710 and radiation splitting device 722. In another example, example radiation redistribution system 700 can include: a despeckler device disposed between radiation splitting device 722 and sector heater branch 724 (e.g., radiation splitting device 730); and another despeckler device disposed between radiation splitting device 722 and preheater branch 726 (e.g., power control device 742). In yet another example, example radiation redistribution system 700 can include a respective despeckler device disposed in each of plurality of optical output channels 792A-N and optical output channel 794.

In some aspects, example radiation redistribution system 700 can further include a splice box 780. In some aspects, splice box 780 can include a plurality of interlocks connected to a plurality of splices, such as splice 782, splice 784, splice 786, splices 788A-N, and splice 790.

In some aspects, each of the optical paths upstream (e.g., to the left as illustrated in FIG. 7) of the plurality of power control devices 732A-D and power control device 742 can include single mode fiber. In some aspects, each of the optical paths downstream (e.g., to the right as illustrated in FIG. 7) of the plurality of power control devices 732A-D and power control device 742 can include circular core fiber with mode mixing elements to provide a flat top beam profile.

In some aspects, example radiation redistribution system 700 can further include a temperature control system 760 communicatively coupled to radiation source 710, splice box 780, radiation splitting system 720, a plurality of heater head optics, a plurality of optical components, or a combination thereof.

In some aspects, temperature control system 760 can be configured to control a temperature of each of a plurality of optical components. In some aspects, temperature control system 760 can be configured to control the temperatures of plurality of optical components by controlling (e.g., feedback control) one or more functions of radiation source 710, plurality of power control devices 732A-N, power control device 742, or a combination thereof based on: temperature values of the plurality of optical components detected by temperature sensors coupled to the plurality of optical components; power values of each radiation beam detected by splice box 780; one or more other suitable parameters; or a combination thereof. In some aspects, temperature control system 760 can be configured to sample radiation beam profiles with greater than about 95 percent uniformity.

In some aspects, plurality of power control devices 732A-N and power control device 742 can be communicatively coupled to temperature control system 760 via a communications box 750. For example, communications box 750 can include a Recommended Standard 232 (RS232) to Inter-Integrated Circuit (I²C) communications control system to individually control each of the plurality of power control devices 732A-N and power control device 742.

In one illustrative and non-limiting example, radiation source 710 can include an 86 watt (W), 1070 nm light source with output power control. Radiation splitting device 722 can include a 40:60 fixed ratio multi-mode fiber (MMF) coupler (e.g., having a 50 micron core) configured to split the input radiation beam into two radiation beams, transmitting about 60 percent of the input radiation beam towards sector heater branch 724 and the other about 40 percent of the input radiation beam towards preheater branch 726.

Continuing this illustrative and non-limiting example, in sector heater branch 724, radiation splitting device 730 can include a 1×4 MMF coupler (e.g., having a 50 micron core) configured to split the radiation beam received from radiation splitting device 722 (e.g., about 60 percent of the input radiation beam) into four radiation beams (e.g., about 8 W each) and transmit each of the four radiation beams towards a respective one of the plurality of power control devices 732A-N. Each of the plurality of power control devices 732A-N can control a power value of, or otherwise condition, the radiation beam respectively received from radiation splitting device 730 and transmit the controlled radiation beam towards a respective one of the plurality of radiation splitting devices 734A-N. Each of the plurality of radiation splitting devices 734A-N can include a 1:99 fixed ratio MMF coupler (e.g., having a 50 micron core) configured to transmit about 1 percent of the output radiation beam towards a respective one of the plurality of power sensors 736A-N and the other about 99 percent of the output radiation beam over a respective one of the plurality of optical output channels 792A-N (e.g., up to seven sector heaters having 0 W to 8 W continuously variable power per segment, with output power control provided by a respective one of the plurality of power control devices 732A-N) towards a respective heater head optic (e.g., a respective sector heater device) configured to heat a respective optical component (e.g., a respective POB mirror surface).

Further continuing this illustrative and non-limiting example, in preheater branch 726, power control device 742 can receive the radiation beam from radiation splitting device 722 (e.g., about 40 percent of the input radiation beam), which can be an about 30 W radiation beam. Power control device 742 can control a power value of, or otherwise condition, the radiation beam received from radiation splitting device 722 and transmit the controlled radiation beam towards radiation splitting device 744. Radiation splitting device 744 can include a 1:99 fixed ratio MMF coupler (e.g., having a 50 micron core) configured to transmit about 1 percent of the output radiation beam towards power sensor 746 and the other about 99 percent of the output radiation beam over optical output channel 794 (e.g., 0 W to 30 W continuously variable power, with output power control provided by power control device 742) towards a heater head optic (e.g., a preheater device) configured to heat an optical component (e.g., a POB mirror surface).

In another illustrative and non-limiting example, the power value of the radiation beam at splice 782 can be about 86 W, the power value of the radiation beam at splice 784 can be about 30 W, the power values of the radiation beams at splices 788A-N can each be about 7.5 W, and the power value of the radiation beam at splice 786 can be about 20 W.

Figure 8:
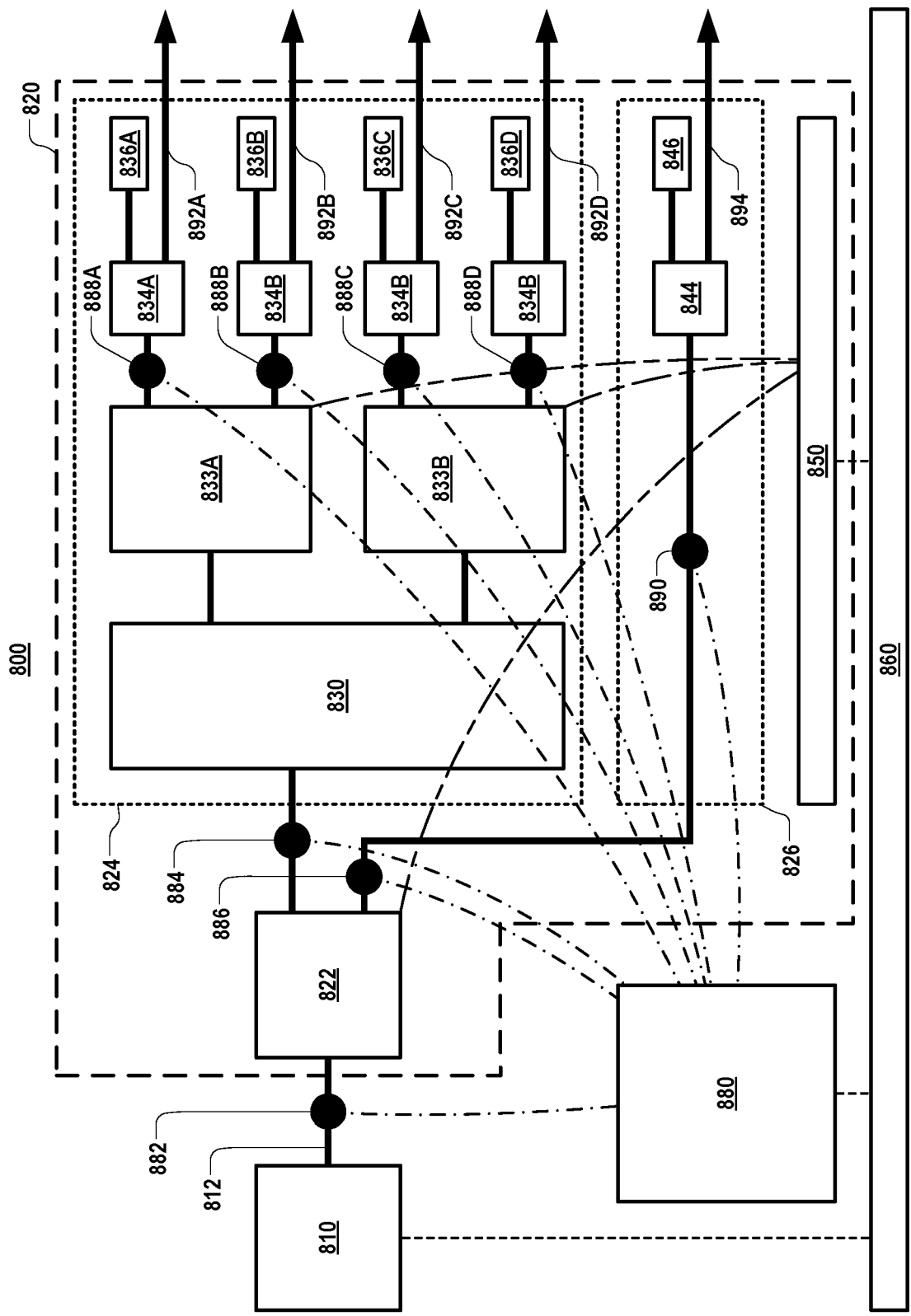
FIG. 8 is a schematic illustration of another example radiation redistribution system according to some aspects of the present disclosure.

FIG. 8 is a schematic illustration of an example radiation redistribution system 800 according to some aspects of the present disclosure. In some aspects, example radiation redistribution system 800 can be configured to thermally stabilize one or more mirror optical surfaces via, for example, a set of preheating devices (e.g., preheater head optics) and a set of sector heating devices (e.g., sector heater head optics).

In some aspects, example radiation redistribution system 800 can include an optical input channel 812 configured to receive an input radiation beam (e.g., an IR radiation beam) from a radiation source 810 (e.g., a multi-channel IR light source). In some aspects, optical input channel 812 can consist of, or consist essentially of, a single input fiber.

In some aspects, example radiation redistribution system 800 can further include a radiation splitting system 820 configured to generate a plurality of output radiation beams based on the input radiation beam. In some aspects, radiation splitting system 820 can include a radiation splitting device 822, which can include, for example, a multi-mode fiber coupler, a fixed ratio coupler, a variable ratio coupler, a beam splitter, any other suitable optical component, or any combination thereof. In some aspects, radiation splitting device 822 can be configured to split the input radiation beam into two radiation beams, transmitting one of the two radiation beams towards a sector heater branch 824 and the other of the two radiation beams towards a preheater branch 826.

In some aspects, sector heater branch 824 of radiation splitting system 820 can further include a radiation splitting device 830, which can include, for example, a multi-mode fiber coupler, a fixed ratio coupler, a variable ratio coupler, a beam splitter, any other suitable optical component, or any combination thereof. In some aspects, radiation splitting device 830 can be configured to split the radiation beam received from radiation splitting device 822 into, two radiation beams and transmit each of the two radiation beams towards a respective one of the radiation splitting devices 833A-B, each of which can include, for example, a multi-mode fiber coupler, a fixed ratio coupler, a variable ratio coupler, a beam splitter, any other suitable optical component, or any combination thereof.

In some aspects, sector heater branch 824 of radiation splitting system 820 can further include a plurality of radiation splitting devices 834A-D, each of which can include, for example, a multi-mode fiber coupler, a fixed ratio coupler, a variable ratio coupler, a beam splitter, any other suitable optical component, or any combination thereof. In some aspects, each of the plurality of radiation splitting devices 834A-D can be configured to split a respective radiation beam received from a respective one of the radiation splitting devices 833A-B into two radiation beams, transmitting a portion of the output radiation beam towards a respective one of a plurality of power sensors 836A-D (e.g., a power and beam profile sensor) and the remaining portion of the output radiation beam over a respective one of the plurality of optical output channels 892A-D towards a respective heater head optic (e.g., a respective sector heater device) configured to heat a respective optical component (e.g., a respective POB mirror surface). In some aspects, plurality of optical output channels 892A-D can include a plurality of circular core fibers with mode-mixing elements for flat-top, far-field profiles. In some aspects, plurality of optical output channels 892A-D can include a plurality of non-circular core fibers (e.g., square, rectangular, or polygon core fibers) to achieve flat top beam profile at the mirror surface.

In some aspects, preheater branch 826 of radiation splitting system 820 can include a radiation splitting device 844, which can include, for example, a multi-mode fiber coupler, a fixed ratio coupler, a variable ratio coupler, a beam splitter, any other suitable optical component, or any combination thereof. In some aspects, radiation splitting device 844 can be configured to split the radiation beam received from radiation splitting device 822 into two radiation beams, transmitting a portion of the output radiation beam towards a power sensor 846 (e.g., a power and beam profile sensor) and the remaining portion of the output radiation beam over an optical output channel 894 towards a heater head optic (e.g., a preheater device) configured to heat an optical component (e.g., a POB mirror surface). In some aspects, optical output channel 894 can include a circular core fiber with mode-mixing elements for a flat-top, far-field profile. In some aspects, optical output channel 894 can include a non-circular core fiber (e.g., a square, rectangular, or polygon core fiber) to achieve a flat top beam profile at the mirror surface.

Additionally or alternatively, in some aspects, radiation splitting system 820 can further include one or more despeckler devices, active/passive mode scrambler devices, or a combination thereof, which can give rise to a flat intensity profile in the far field at the mirror surfaces. For example, example radiation redistribution system 800 can include a despeckler device disposed between radiation source 810 and radiation splitting device 822. In another example, example radiation redistribution system 800 can include: a despeckler device disposed between radiation splitting device 822 and sector heater branch 824 (e.g., radiation splitting device 830); and another despeckler device disposed between radiation splitting device 822 and preheater branch 826 (e.g., radiation splitting device 844). In yet another example, example radiation redistribution system 800 can include a respective despeckler device disposed in each of plurality of optical output channels 892A-D and optical output channel 894.

In some aspects, example radiation redistribution system 800 can further include a splice box 880. In some aspects, splice box 880 can include a plurality of interlocks connected to a plurality of splices, such as splice 882, splice 884, splice 886, splices 888A-D, and splice 890. In some aspects, each of the optical paths upstream (e.g., to the left as illustrated in FIG. 8) of the plurality of splices 888A-D and splice 890 can include single mode fiber. In some aspects, each of the optical paths downstream (e.g., to the right as illustrated in FIG. 8) of the plurality of splices 888A-D and splice 890 can include multi mode fiber (e.g., 50 micron core). In some aspects, each of splice 882, splice 884, and splice 886 can be a single mode fiber to single mode fiber (SMF-SMF) splice. In some aspects, each of the plurality of splices 888A-D and splice 890 can be a single mode fiber to multi mode fiber (SMF-MMF) splice.

In some aspects, example radiation redistribution system 800 can further include a temperature control system 860 communicatively coupled to radiation source 810, splice box 880, radiation splitting system 820, a plurality of heater head optics, a plurality of optical components, or a combination thereof. In some aspects, temperature control system 860 can be configured to control a temperature of each of a plurality of optical components. In some aspects, temperature control system 860 can be configured to control the temperatures of plurality of optical components by controlling (e.g., feedback control) one or more functions of radiation source 810, radiation splitting device 822 (e.g., a variable ratio coupler), radiation splitting devices 833A-B (e.g., variable ratio couplers), or a combination thereof based on: temperature values of the plurality of optical components detected by temperature sensors coupled to the plurality of optical components; power values of each radiation beam detected by splice box 880; one or more other suitable parameters; or a combination thereof.

In some aspects, radiation splitting device 822 and radiation splitting devices 833A-B can be communicatively coupled to temperature control system 860 via a communications box 850. For example, communications box 850 can include an RS232 to I$^2$C communications control system to individually control each of radiation splitting device 822 and radiation splitting devices 833A-B (e.g., each of which can be a variable ratio coupler).

In one illustrative and non-limiting example, radiation source 810 can include an 86 W, 1070 nm light source with output power control. Radiation splitting device 822 can include a variable ratio coupler (e.g., a continuously variable ratio coupler from 1:99 to 99:1) configured to split the input radiation beam into two radiation beams, transmitting about 60 percent of the input radiation beam towards sector heater branch 824 and the other about 40 percent of the input radiation beam towards preheater branch 826. Radiation splitting device 822 can be controllable by temperature control system 860 via communications box 850.

Continuing this illustrative and non-limiting example, in sector heater branch 824, radiation splitting device 830 can include a 1×2 variable ratio coupler configured to split the radiation beam received from radiation splitting device 822 (e.g., about 51.6 W) into two radiation beams (e.g., a first radiation beam between about 51.6 W and 0 W, and a second radiation beam between about 0 W and 51.6 W complementary to the first beam) and transmit each of the two radiation beams towards a respective one of the radiation splitting devices 833A-B. Each of the radiation splitting devices 833A-B can include a 1×2 variable ratio coupler controllable by temperature control system 860 via communications box 850 and configured to split the radiation beam respectively received from radiation splitting device 830 into two radiation beams. Radiation splitting devices 833A-B can transmit each of the split radiation beams towards a respective one of the plurality of radiation splitting devices 834A-D. Each of the plurality of radiation splitting devices 834A-D can include a 1:99 fixed ratio MMF coupler (e.g., having a 50 micron core) configured to transmit about 1 percent of the output radiation beam towards a respective one of the plurality of power sensors 836A-D and the other about 99 percent of the output radiation beam over a respective one of the plurality of optical output channels 892A-D towards a respective heater head optic (e.g., a respective sector heater device) configured to heat a respective optical component (e.g., a respective POB mirror surface).

Further continuing this illustrative and non-limiting example, in preheater branch 826, radiation splitting device 844 can receive the radiation beam from radiation splitting device 822 (e.g., about 40 percent of the input radiation beam), which can be an about 34.4 W radiation beam. Radiation splitting device 844 can include a 1:99 fixed ratio MMF coupler (e.g., having a 50 micron core) configured to transmit about 1 percent of the output radiation beam towards power sensor 846 and the other about 99 percent of the output radiation beam over optical output channel 894 towards a heater head optic (e.g., a preheater device) configured to heat an optical component (e.g., a POB mirror surface).

Further continuing this illustrative and non-limiting example, the power value of the radiation beam at splice 882 can be about 86 W, the power value of the radiation beam at splice 884 can be about 51.6 W, the power value of the radiation beam received by radiation splitting device 833A can be between about 51.6 W and about 0 W, the power value of the radiation beam received by radiation splitting device 833B can be between about 0 W and about 51.6 W complementary to the power value of the radiation beam received by radiation splitting device 833A, and the power value of the radiation beam at splice 886 can be about 34.4 W.

Example Processes for Heating a Plurality of Optical Components

Figure 9:
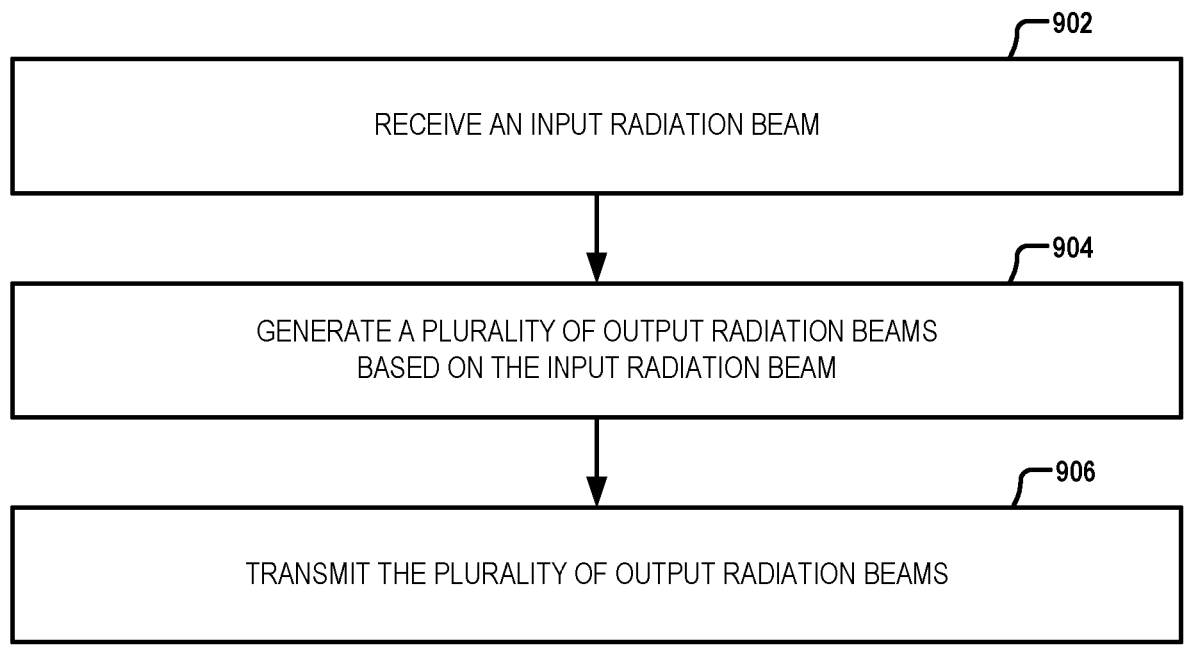
FIG. 9 is an example method for heating a plurality of optical components according to some aspects of the present disclosure or portion(s) thereof.

FIG. 9 is an example method 900 for heating a plurality of optical components (e.g., disposed in or associated with the projection optics of a lithographic apparatus) according to some aspects of the present disclosure or portion(s) thereof. The operations described with reference to example method 900 can be performed by, or according to, any of the systems, apparatuses, components, techniques, or combinations thereof described herein, such as those described with reference to FIGS. 1-8 above and FIG. 10 below.

At operation 902, the method can include receiving, by an optical input channel (e.g., optical input channel 512, 612, 712, 812), an input radiation beam from a radiation source (e.g., radiation source 510, 710, 810). In some aspects, the optical input channel can consist of, or consist essentially of, a single input fiber. In some aspects, the receipt of the input radiation beam can be accomplished using suitable mechanical or other methods and include receiving the input radiation beam in accordance with any aspect or combination of aspects described with reference to FIGS. 1-8 above and FIG. 10 below.

At operation 904, the method can include generating, by a set of radiation splitting devices included in a radiation splitting system (e.g., radiation splitting system 520, 620, 720, 820), a plurality of output radiation beams based on the input radiation beam. The set of radiation splitting devices can include, for example, one or more multi-mode fiber couplers, one or more fixed ratio couplers, one or more variable ratio couplers, one or more beam splitters, one or more of any other suitable optical component, or any combination thereof. In some aspects, the generation of the plurality of output radiation beams can be accomplished using suitable mechanical or other methods and include generating the plurality of output radiation beams in accordance with any aspect or combination of aspects described with reference to FIGS. 1-8 above and FIG. 10 below.

At operation 906, the method can include transmitting, by a plurality of optical output channels (e.g., plurality of optical output channels 532A-N, 632A-N, 792A-N, 892A-D; optical output channel 794, 894), the plurality of output radiation beams towards a plurality of optical components (e.g., plurality of optical components 540A-N) via a plurality of heater head optics (e.g., plurality of heater head optics 538A-N). In some aspects, the plurality of heater head optics can include a set of preheating devices associated with one or more POB mirror surfaces. In some aspects, the plurality of heater head optics can further include a set of sector heating devices associated with the one or more POB mirror surfaces. Optionally, at or in association with operation 906, the method can include realizing a flat-top far-field profile at fiber end by utilizing a fiber with mode mixing elements or a square or rectangular core fiber. In some aspects, the transmission of the plurality of output radiation beams can be accomplished using suitable mechanical or other methods and include transmitting the plurality of output radiation beams in accordance with any aspect or combination of aspects described with reference to FIGS. 1-8 above and FIG. 10 below.

Optionally, the method can further include controlling, by a plurality of power control devices (e.g., plurality of power control devices 624A-N, 732A-N; power control device 742), a respective power value of each of the plurality of output radiation beams. In some aspects, the plurality of power control devices can include a plurality of variable optical attenuators. In some aspects, the controlling of the power values can be accomplished using suitable mechanical or other methods and include controlling the power values in accordance with any aspect or combination of aspects described with reference to FIGS. 1-8 above and FIG. 10 below.

Example Computing System

Aspects of the disclosure can be implemented in hardware, firmware, software, or any combination thereof.

Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 10:
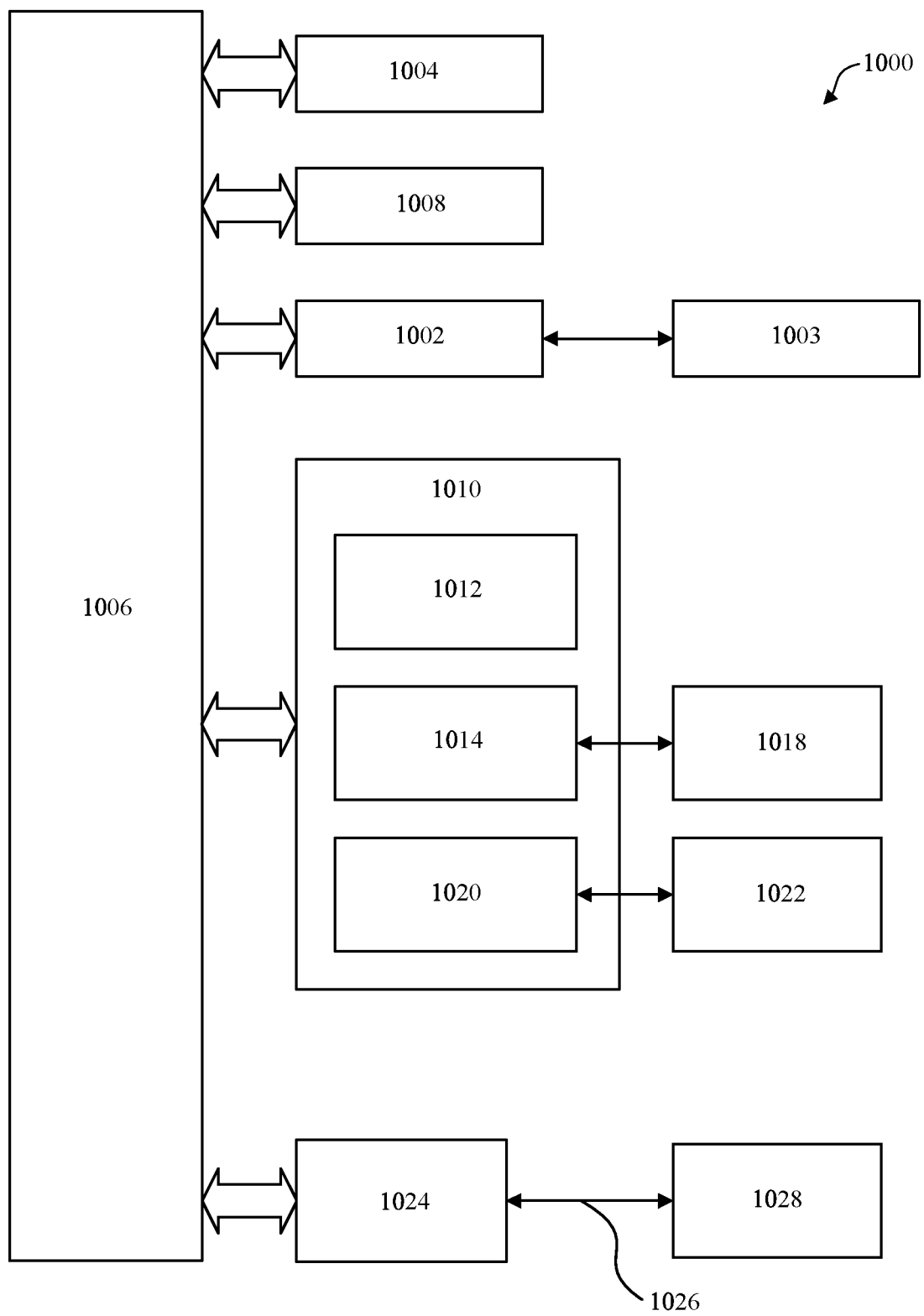
FIG. 10 is an example computer system for implementing some aspects of the present disclosure or portion(s) thereof.

Various aspects can be implemented, for example, using one or more computing systems, such as example computing system 1000 shown in FIG. 10. Example computing system 1000 can be a specialized computer capable of performing the functions described herein such as: the example laser system 401 described with reference to FIG. 4; the temperature control system 560 described with reference to FIG. 5; the temperature control system 760 described with reference to FIG. 7; the temperature control system 860 described with reference to FIG. 8; any other suitable system, sub-system, or component; or any combination thereof. Example computing system 1000 can include one or more processors (also called central processing units, or CPUs), such as a processor 1004. Processor 1004 is connected to a communication infrastructure 1006 (e.g., a bus). Example computing system 1000 can also include user input/output device(s) 1003, such as monitors, keyboards, pointing devices, etc., that communicate with communication infrastructure 1006 through user input/output interface(s) 1002. Example computing system 1000 can also include a main memory 1008 (e.g., one or more primary storage devices), such as random access memory (RAM). Main memory 1008 can include one or more levels of cache. Main memory 1008 has stored therein control logic (e.g., computer software) and/or data.

Example computing system 1000 can also include a secondary memory 1010 (e.g., one or more secondary storage devices). Secondary memory 1010 can include, for example, a hard disk drive 1012 and/or a removable storage drive 1014. Removable storage drive 1014 can be a floppy disk drive, a magnetic tape drive, a compact disk drive, an optical storage device, tape backup device, and/or any other storage device/drive.

Removable storage drive 1014 can interact with a removable storage unit 1018. Removable storage unit 1018 includes a computer usable or readable storage device having stored thereon computer software (control logic) and/or data. Removable storage unit 1018 can be a floppy disk, magnetic tape, compact disk, DVD, optical storage disk, and/or any other computer data storage device. Removable storage drive 1014 reads from and/or writes to removable storage unit 1018.

According to some aspects, secondary memory 1010 can include other means, instrumentalities or other approaches for allowing computer programs and/or other instructions and/or data to be accessed by example computing system 1000. Such means, instrumentalities or other approaches can include, for example, a removable storage unit 1022 and an interface 1020. Examples of the removable storage unit 1022 and the interface 1020 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1000 can further include a communications interface 1024 (e.g., one or more network interfaces). Communications interface 1024 enables example computing system 1000 to communicate and interact with any combination of remote devices, remote networks, remote entities, etc. (individually and collectively referred to as remote devices 1028). For example, communications interface 1024 can allow example computing system 1000 to communicate with remote devices 1028 over communications path 1026, which can be wired and/or wireless, and which can include any combination of LANs, WANs, the Internet, etc. Control logic, data, or both can be transmitted to and from example computing system 1000 via communications path 1026.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1000, main memory 1008, secondary memory 1010 and removable storage units 1018 and 1022, as well as tangible articles of manufacture embodying any combination of the foregoing. Such control logic, when executed by one or more data processing devices (such as example computing system 1000), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 10. In particular, aspects of the disclosure can operate with software, hardware, and/or operating system implementations other than those described herein.

Embodiments of the present disclosure can be further described by the following clauses.
1. A system, comprising:
   a radiation redistribution system configured to provide radiation for heating a plurality of optical components, wherein the radiation redistribution system comprises:
      an optical input channel configured to receive an input radiation beam from a radiation source;
      an radiation splitting system configured to generate a plurality of output radiation beams based on the input radiation beam; and
      a plurality of optical output channels configured to transmit the plurality of output radiation beams towards a plurality of heater head optics configured to heat the plurality of optical components.
2. The system of clause 1, wherein the optical input channel consists essentially of a single input fiber.
3. The system of clause 1, wherein the radiation splitting system comprises a multi-mode fiber coupler.

4. The system of clause 3, wherein the radiation splitting system comprises a fixed ratio coupler.

5. The system of clause 3, wherein the radiation splitting system comprises a variable ratio coupler.

6. The system of clause 1, wherein the radiation splitting system comprises a beam splitter.

7. The system of clause 1, wherein the radiation redistribution system further comprises a plurality of power control devices configured to control a respective power value of each of the plurality of output radiation beams.

8. The system of clause 7, wherein the plurality of power control devices comprise a plurality of variable optical attenuators.

9. The system of clause 1, wherein the radiation redistribution system further comprises a despeckler device.

10. An apparatus, comprising:
   an optical input channel configured to receive an input radiation beam from a radiation source;
   a set of radiation splitting devices configured to generate a plurality of output radiation beams based on the input radiation beam; and
   a plurality of optical output channels configured to transmit the plurality of output radiation beams towards a plurality of heater head optics configured to heat a plurality of optical components.

11. The apparatus of clause 10, wherein the optical input channel consists essentially of a single input fiber.

12. The apparatus of clause 10, wherein the set of radiation splitting devices comprises a multi-mode fiber coupler.

13. The apparatus of clause 12, wherein the set of radiation splitting devices comprises a fixed ratio coupler.

14. The apparatus of clause 12, wherein the set of radiation splitting devices comprises a variable ratio coupler.

15. The apparatus of clause 10, wherein the set of radiation splitting devices comprises a beam splitter.

16. The apparatus of clause 10, wherein the apparatus further comprises a plurality of power control devices configured to control a respective power value of each of the plurality of output radiation beams.

17. The apparatus of clause 16, wherein the plurality of power control devices comprise a plurality of variable optical attenuators.

18. The apparatus of clause 10, wherein the apparatus further comprises a despeckler device.

19. A method, comprising:
   receiving, by an optical input channel, an input radiation beam from a radiation source;
   generating, by a set of radiation splitting devices, a plurality of output radiation beams based on the input radiation beam; and
   transmitting, by a plurality of optical output channels, the plurality of output radiation beams towards a plurality of heater head optics configured to heat a plurality of optical components.

20. The method of clause 19, further comprising controlling, by a plurality of power control devices, a respective power value of each of the plurality of output radiation beams.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A system, comprising:
   a radiation redistribution system configured to provide radiation to heat a plurality of mirrors, wherein the radiation redistribution system comprises:
      an optical input channel configured to receive an input radiation beam from a radiation source;

a radiation splitting system configured to generate a plurality of output radiation beams based on the input radiation beam;

a plurality of optical output channels configured to transmit the plurality of output radiation beams towards a plurality of heater head optics configured to heat the plurality of mirrors, wherein the plurality of heater head optics comprises:

a plurality of preheaters configured to thermally condition one or more mirrors of the plurality of mirrors when not exposed to EUV radiation, and a plurality of sector heaters configured to thermally condition the one or more mirrors of the plurality of mirrors during and/or after exposure to EUV radiation; and a controller coupled to the plurality of preheaters and the plurality of sector heaters to control operation of the respective thermal conditioning.

2. The system of claim 1, wherein the optical input channel consists essentially of a single input fiber.

3. The system of claim 1, wherein the radiation splitting system comprises a multi-mode fiber coupler.

4. The system of claim 3, wherein the radiation splitting system comprises a fixed ratio coupler.

5. The system of claim 3, wherein the radiation splitting system comprises a variable ratio coupler.

6. The system of claim 1, wherein the radiation splitting system comprises a beam splitter.

7. The system of claim 1, wherein the radiation redistribution system further comprises a plurality of power control devices configured to control a respective power value of each of the plurality of output radiation beams.

8. The system of claim 7, wherein the plurality of power control devices comprises a plurality of variable optical attenuators.

9. The system of claim 1, wherein the radiation redistribution system further comprises a despeckler device.

10. The system of claim 1, wherein each one of the plurality of preheaters corresponds to a given one of the plurality of the mirrors.

11. The system of claim 1, wherein the plurality of sector heaters thermally condition plural sectors at a back side of each of the plurality of mirrors.

12. An apparatus, comprising:

an optical input channel configured to receive an input radiation beam from a radiation source;

a set of radiation splitting devices configured to generate a plurality of output radiation beams based on the input radiation beam; and a plurality of optical output channels configured to transmit the plurality of output radiation beams towards a plurality of heater head optics configured to heat a plurality of mirrors, wherein the plurality of heater head optics comprises:

a plurality of preheaters configured to thermally condition one or more mirrors of the plurality of mirrors when not exposed to EUV radiation, and a plurality of sector heaters configured to thermally condition the one or more mirrors of the plurality of mirrors during and/or after exposure to EUV radiation; and a controller coupled to the plurality of preheaters and the plurality of sector heaters to control operation of the respective thermal conditioning.

13. The apparatus of claim 12, wherein the optical input channel consists essentially of a single input fiber.

14. The apparatus of claim 12, wherein the set of radiation splitting devices comprises a multi-mode fiber coupler.

15. The apparatus of claim 14, wherein the set of radiation splitting devices comprises a fixed ratio coupler.

16. The apparatus of claim 14, wherein the set of radiation splitting devices comprises a variable ratio coupler.

17. The apparatus of claim 12, wherein the set of radiation splitting devices comprises a beam splitter.

18. The apparatus of claim 12, wherein the apparatus further comprises a plurality of power control devices configured to control a respective power value of each of the plurality of output radiation beams.

19. The apparatus of claim 18, wherein the plurality of power control devices comprises a plurality of variable optical attenuators.

20. The apparatus of claim 12, wherein the apparatus further comprises a despeckler device.

21. The apparatus of claim 12, wherein each one of the plurality of preheaters corresponds to a given one of the plurality of the mirrors.

22. The apparatus of claim 12, wherein the plurality of sector heaters thermally condition plural sectors at a back side of each of the plurality of mirrors.

23. A method, comprising:

receiving, by an optical input channel, an input radiation beam from a radiation source;

generating, by a set of radiation splitting devices, a plurality of output radiation beams based on the input radiation beam;

transmitting, by a plurality of optical output channels, the plurality of output radiation beams towards a plurality of heater head optics configured to heat a plurality of mirrors, wherein the plurality of heater head optics comprises a plurality of preheaters and a plurality of sector heaters;

controlling the plurality of preheaters to thermally condition one or more mirrors of the plurality of mirrors when not exposed to EUV radiation; and controlling the plurality of sector heaters to thermally condition the one or more mirrors of the plurality of mirrors during and/or after exposure to EUV radiation.

24. The method of claim 23, further comprising controlling, by a plurality of power control devices, a respective power value of each of the plurality of output radiation beams.

* * * * *